United States Patent
Banerjee et al.

(10) Patent No.: US 6,767,842 B2
(45) Date of Patent: Jul. 27, 2004

(54) IMPLEMENTATION OF SI-GE HBT WITH CMOS PROCESS

(75) Inventors: Robi Banerjee, Gresham, OR (US); Derryl J. Allman, Camas, WA (US); David T. Price, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/191,670

(22) Filed: Jul. 9, 2002

(65) Prior Publication Data

US 2004/0007761 A1 Jan. 15, 2004

(51) Int. Cl.⁷ .......................................... H01L 21/302
(52) U.S. Cl. ...................... 438/752; 438/309; 438/313; 438/325; 438/335; 257/616; 257/742
(58) Field of Search ................................ 438/309, 752, 438/313, 325, 335, 933, 205, 340, 316; 257/616, 742, 552, 565, 557, 556

(56) References Cited

U.S. PATENT DOCUMENTS

| | | | |
|---|---|---|---|
| 4,566,914 A | 1/1986 | Hall | |
| 4,929,566 A | 5/1990 | Beitman | |
| 5,273,930 A | * 12/1993 | Steele et al. | 438/312 |
| 5,554,562 A | 9/1996 | Chang et al. | |
| 5,950,097 A | 9/1999 | Chang et al. | |
| 6,506,661 B1 | 1/2003 | Chang et al. | |
| 6,509,242 B2 | * 1/2003 | Frei et al. | 438/312 |
| 6,562,736 B2 | * 5/2003 | Yanagawa et al. | 438/795 |
| 6,617,226 B1 | 9/2003 | Suguro et al. | |
| 2003/0077869 A1 | * 4/2003 | Kamekona et al. | 438/309 |

* cited by examiner

Primary Examiner—David Nelms
Assistant Examiner—Long Tran
(74) Attorney, Agent, or Firm—Trexler, Bushnell, Giangiorgi & Blackstone Ltd.

(57) ABSTRACT

A semiconductor device wherein Si—Ge is the base of a bipolar transistor and a Silicon layer is the emitter. A method of making such a semiconductor device including steps of forming a Silicon dioxide layer on a Silicon substrate, using a photo resist application and exposure to define where a HBT device will be placed. Plasma etching the Silicon dioxide layer to define an undercut, epitaxially growing an Si—Ge layer and a Silicon layer, and continuing manufacture to form one or more bipolar and CMOS devices and define interconnect and passivation.

6 Claims, 5 Drawing Sheets

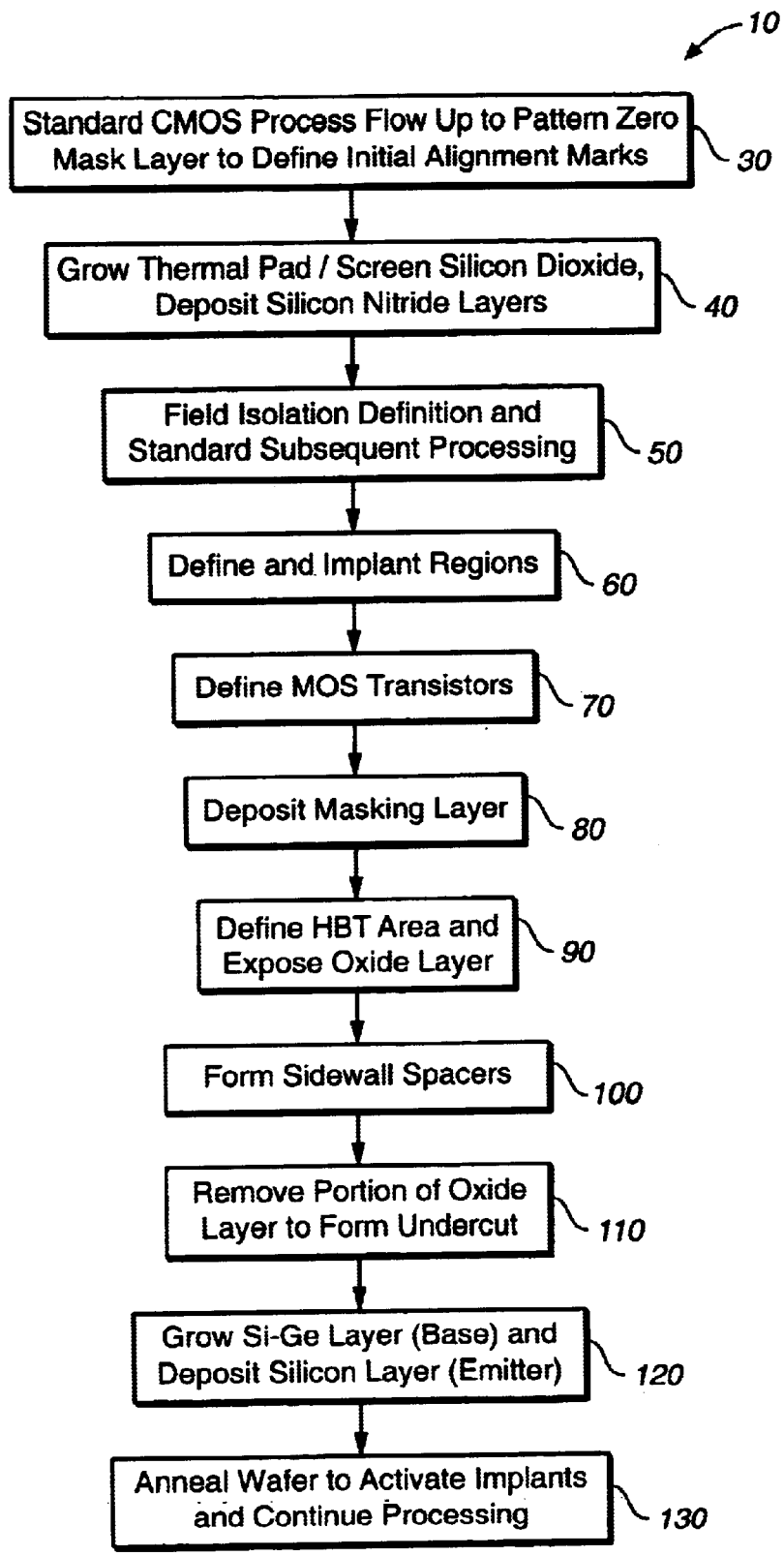
FIG._1

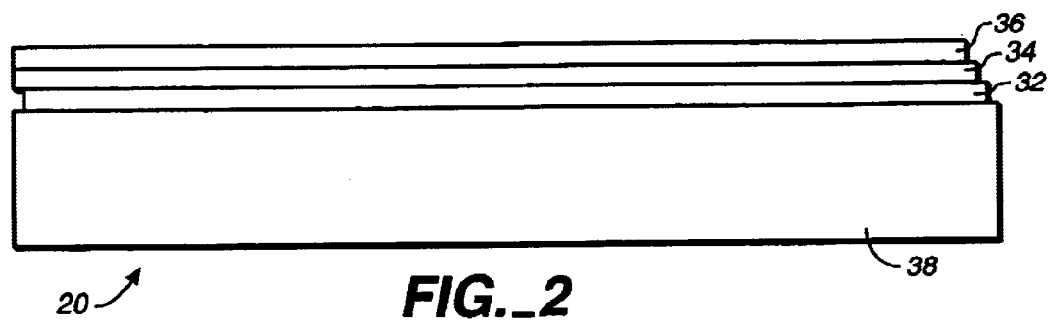
FIG._2
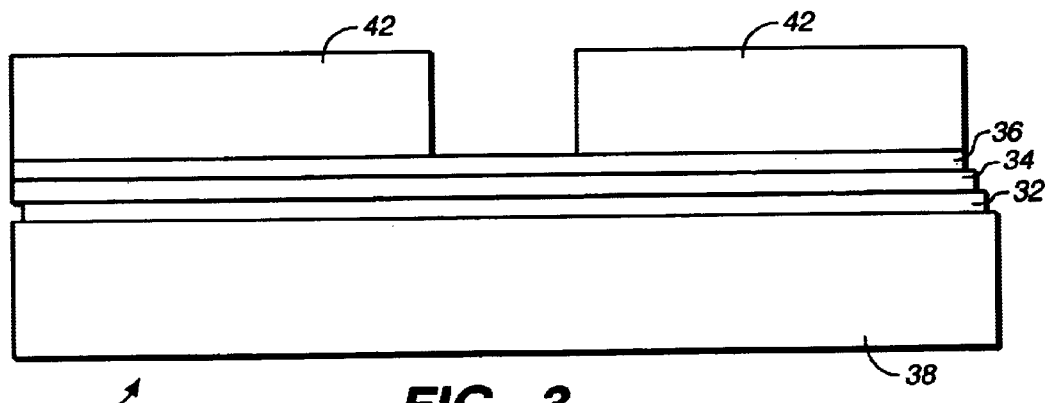
FIG._3
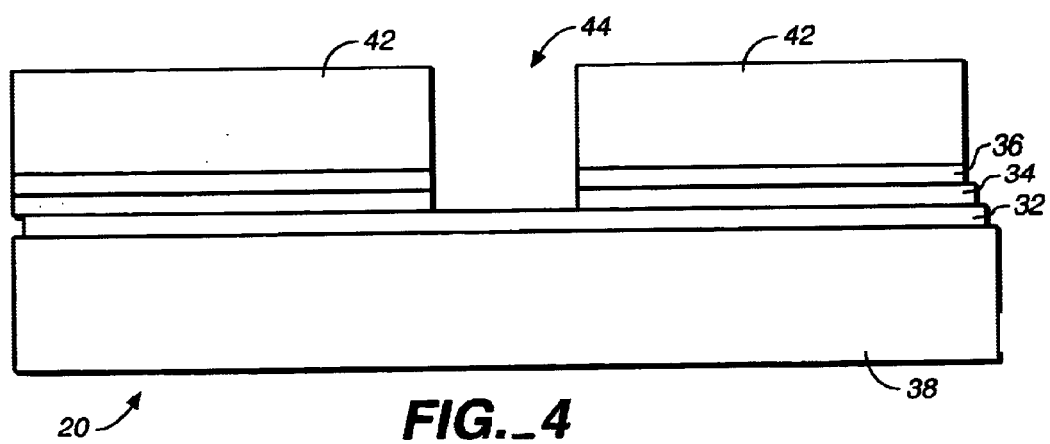
FIG._4

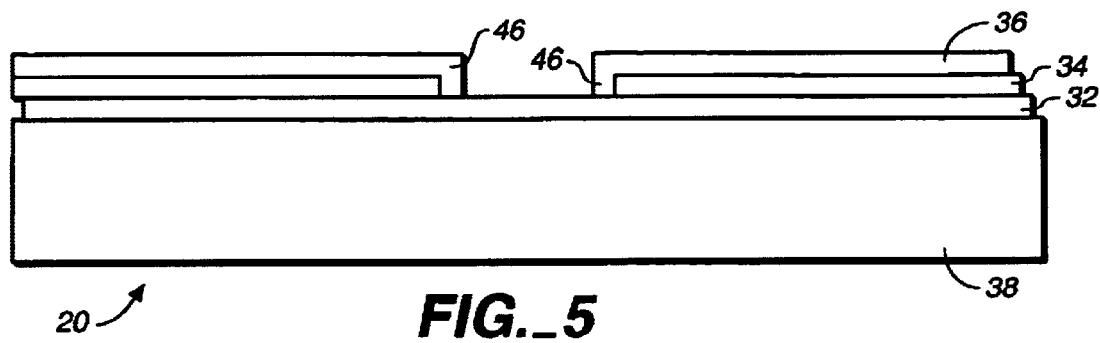
FIG._5
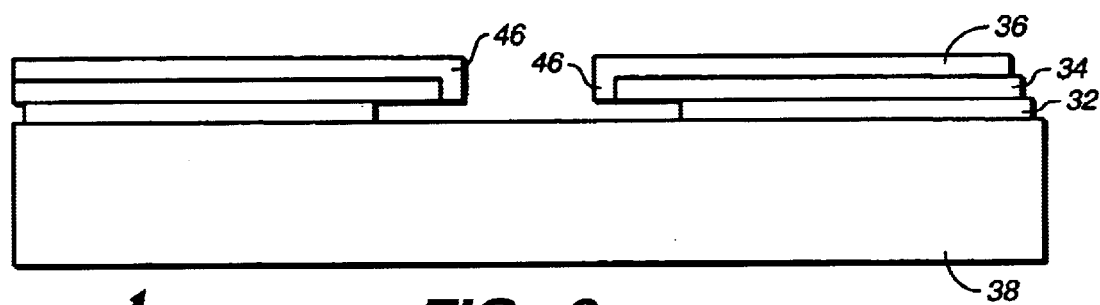
FIG._6
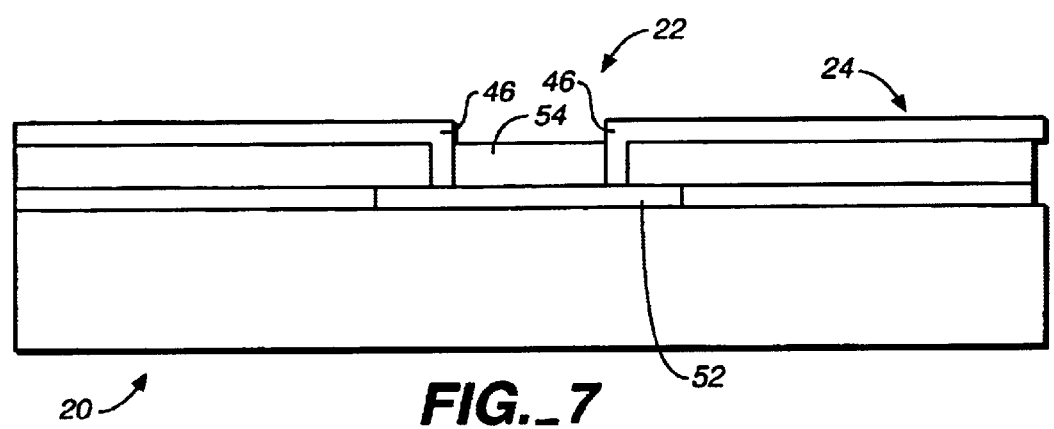
FIG._7

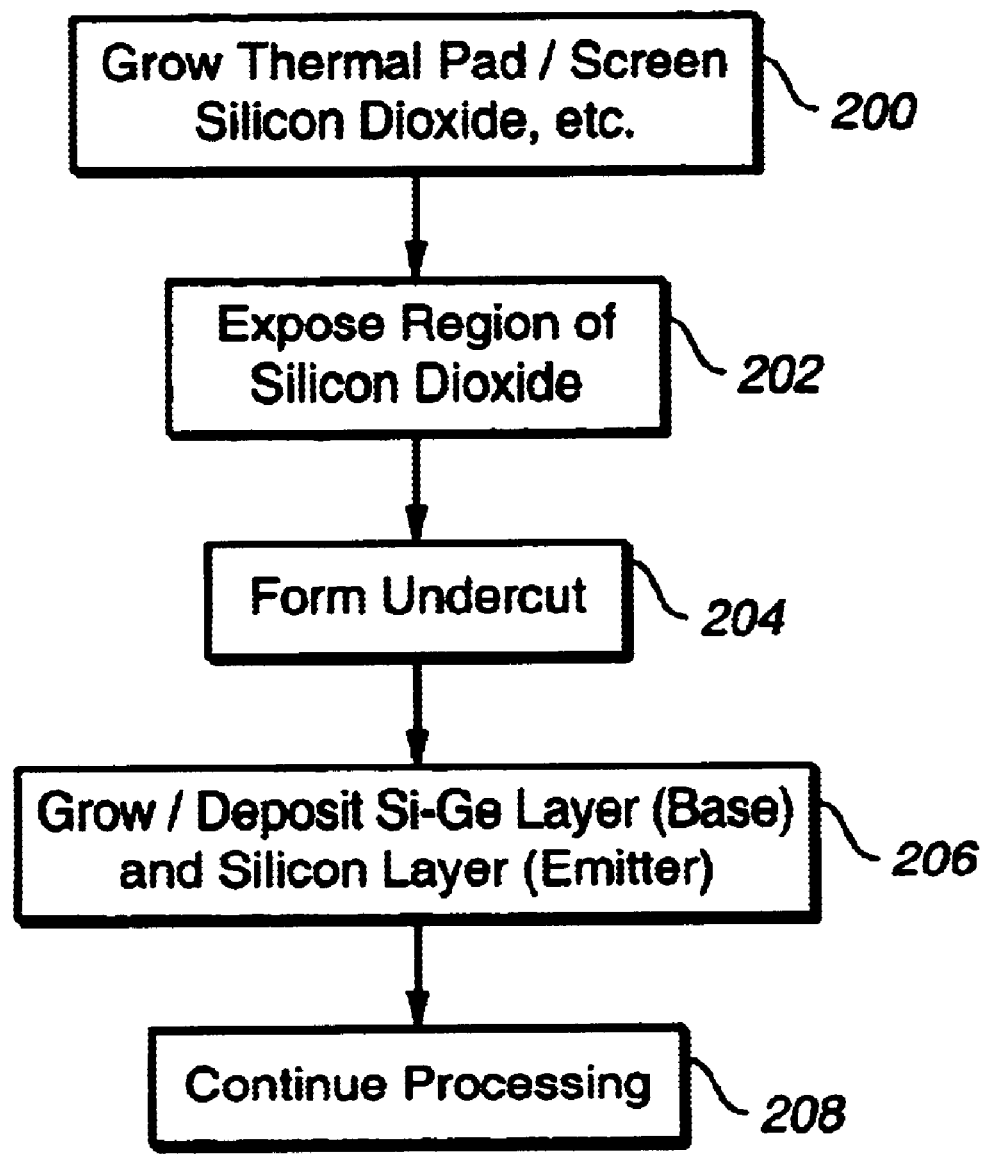
FIG._8

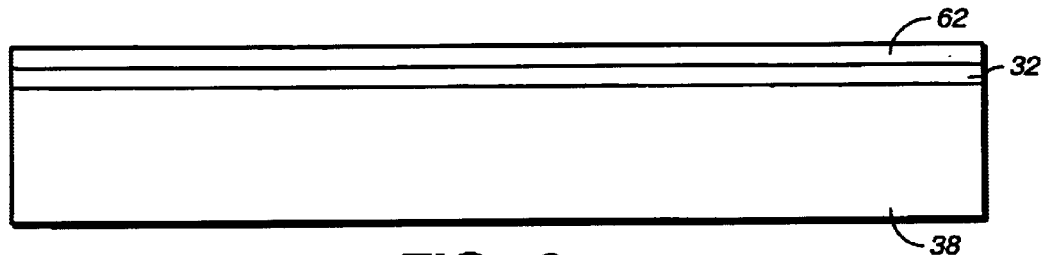
FIG._9
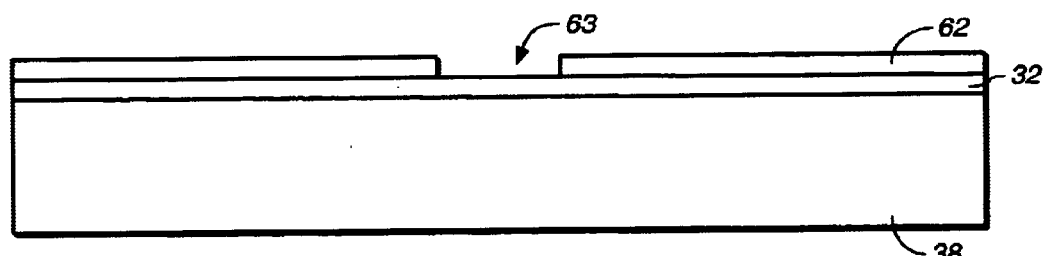
FIG._10
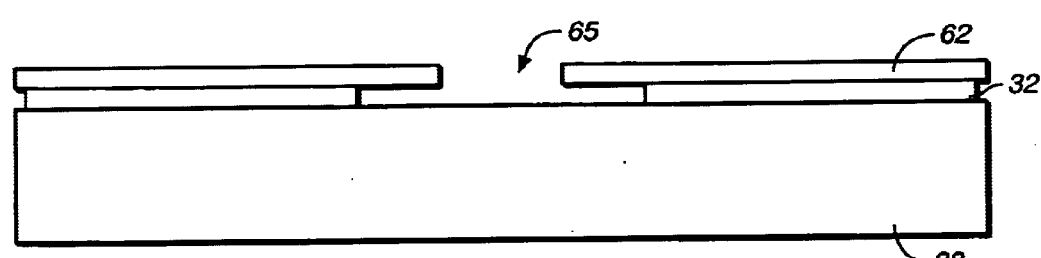
FIG._11
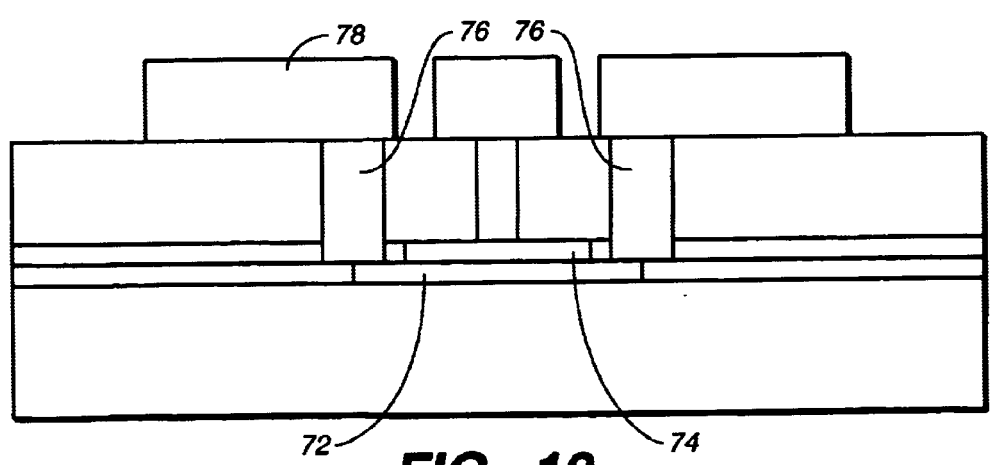
FIG._12

IMPLEMENTATION OF SI-GE HBT WITH CMOS PROCESS

BACKGROUND

The present invention generally relates to semiconductor process integration, and more specifically relates to a semiconductor device which has Si—Ge on Silicon and a layer of Si—Ge forms the base of a bipolar transistor and a layer of Silicon on the layer of Si—Ge forms the emitter of the bipolar transistor, and a method of making a semiconductor device where the method includes depositing Si—Ge on Silicon, and the method provides that a layer of Si—Ge forms the base of a bipolar transistor and a layer of Silicon on the layer of Si—Ge forms the emitter of the bipolar transistor.

The semiconductor industry has been constantly striving to improve the data transfer speed for communications using silicon-based semiconductor devices (i.e., semiconductor products). To date, various schemes and improvements have been proposed, both in the area of process technology and circuit design, in order to handle the higher frequencies required for data transmission with lower power consumption.

Present semiconductor devices are typically configured such that FET transistors and other devices, such as speed-performance sensitive parts of a circuit, are disposed on Silicon. As such, carrier flow is not forced to a surface channel region. This causes short channel effects, thereby resulting in leakage and/or increased power consumption. Additionally, as transistor sizes shrink, the electron hole carrier mobility and the device noise needs to be improved to provide adequate performance and circuit design margin.

OBJECTS AND SUMMARY

A general object of an embodiment of the present invention is to provide a semiconductor device which has at least a region that provides Si—Ge on Silicon and a Silicon layer on the Si—Ge, where the semiconductor device is configured such that the Si—Ge forms the base of a bipolar transistor and the Silicon on the Si—Ge forms the emitter of the bipolar transistor.

Another object of an embodiment of the present invention is to provide a method of making a semiconductor device, where the method includes depositing Si—Ge on Silicon, and the method provides that a layer of Si—Ge forms the base of a bipolar transistor and a layer of Silicon on the layer of Si—Ge forms the emitter of the bipolar transistor.

Still another object of an embodiment of the present invention is to provide a method of making semiconductor device which eliminates processing steps which are typically required to form an emitter over the base region.

Still yet another object of an embodiment of the present invention is to provide a semiconductor device which includes a strained silicon layer which provides increased mobility of electrons through the base.

Yet still another object of an embodiment of the present invention is to provide a semiconductor device which has a thin base region with a high dopant concentration and abrupt doping profiles.

Another object of an embodiment of the present invention is to provide a semiconductor device which provides retardation in dopant diffusion out for the base region, caused by the incorporation of dopants near the junction interfaces.

Another object of an embodiment of the present invention is to provide a method of making a semiconductor device wherein oxygen is incorporated into the base at the emitter to base junction to increase barrier potential and subsequent emitter efficiency of the device.

Another object of an embodiment of the present invention is to provide a method of making a semiconductor device which consumes less dynamic power due to a higher operating frequency.

Another object of an embodiment of the present invention is to provide a method of making a semiconductor device which provides that base contact is made by either tungsten plugs or by the use of poly silicon.

Briefly, and in accordance with at least one of the forgoing objects, an embodiment of the present invention provides a semiconductor device which has at least a region where Si—Ge is disposed on Silicon. Specifically, the semiconductor device preferably includes Si—Ge disposed on a Silicon substrate. The semiconductor device may include a Silicon region which does not include any Si—Ge, but preferably also includes an Si—Ge region which includes Si—Ge on Silicon. Preferably, the Si—Ge is provided as an Si—Ge layer which is disposed between a Silicon layer and the Silicon substrate, and the Si—Ge forms the base of a bipolar transistor and the Silicon layer on the Si—Ge forms the emitter of the bipolar transistor.

A method of making such a semiconductor device is also provided, and includes steps of forming an oxide layer on a Silicon substrate, masking at least a portion of the oxide layer to define a deep collector implant and N well implants, Vt adjusting the implant to define the CMOS (FET) devices, mask at least a portion of the oxide layer and implant dopant to form a collector region of a bipolar transistor, masking to define one or more selective areas within a chip on which epitaxial Si—Ge and a Silicon layer will be grown, removing (such as by wet etching) at least a portion of the oxide layer in order to expose a portion of the Silicon substrate and create an undercut in open areas defined by the previous masking step, epitaxially growing an Si—Ge layer on the exposed portion of the Silicon substrate, epitaxially growing a Silicon layer on the Si—Ge layer, if regions are not doped then masking and implanting dopant to define the base and emitter regions of the bipolar transistor, and continuing manufacture of the device by forming one or more bipolar and CMOS devices and continuing until the end of the line to define interconnect and passivation.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a block diagram of a method which is in accordance with an embodiment of the present invention; and FIG. 2 is a general schematic view of a semiconductor device illustrating one of the steps of the method shown in FIG. 1, wherein layers of Silicon dioxide, Polysilicon (or Silicon nitride), and Silicon nitride (or oxide) are disposed on a Silicon substrate;

FIG. 3 is a general schematic view of a semiconductor device illustrating a subsequent step of the method shown in FIG. 1, wherein an area where an HBT device is to be formed is defined;

FIG. 4 is a general schematic view of a semiconductor device illustrating a subsequent step of the method shown in FIG. 1, wherein portions of layers are removed to expose an underlying oxide layer;

FIG. 5 is a general schematic view of a semiconductor device illustrating a subsequent step of the method shown in FIG. 1, wherein sidewall spacers are formed;

FIG. 6 is a general schematic view of a semiconductor device illustrating a subsequent step of the method shown in FIG. 1, wherein oxide is removed to form an undercut;

FIG. 7 is a general schematic view of a semiconductor device illustrating a subsequent step of the method shown in FIG. 1, wherein an Si—Ge layer is formed and a layer of Silicon is formed to provide a base and emitter, respectively;

FIG. 8 is a block diagram of a method which is in accordance with another embodiment of the present invention;

FIG. 9 is general schematic view of a semiconductor device illustrating a subsequent step of the method shown in FIG. 8, wherein layers of Silicon dioxide and Silicon nitride are disposed on a Silicon substrate;

FIG. 10 is general schematic view of a semiconductor device illustrating a subsequent step of the method shown in FIG. 8, wherein an area where an HBT device is to be formed is defined;

FIG. 11 is general schematic view of a semiconductor device illustrating a subsequent step of the method shown in FIG. 8, wherein a region of the Silicon dioxide layer is removed and an undercut is formed; and FIG. 12 is general schematic view of a semiconductor device illustrating a subsequent step of the method shown in FIG. 8, wherein an Si—Ge layer is formed and a layer of Silicon is formed to provide a base and emitter, respectively.

DESCRIPTION

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

FIG. 1 illustrates, in block diagram form, a method 10 of making a semiconductor device, and FIGS. 2–7 illustrate a semiconductor device 20 being made in accordance with the steps shown in FIG. 1. Both the method 10 of making the semiconductor device 20 and the structure of the semiconductor device 20 itself are embodiments of the present invention.

Generally, the method 10 shown in FIG. 1 includes the step of depositing Si—Ge on Silicon. As a result, both an Si—Ge region 22 and a Silicon region 24 is formed on the semiconductor device 20 (see FIG. 7). This provides that speed performance sensitive parts of the circuit may be built on the Si—Ge region(s) 22 within the die, while non-speed sensitive designs or legacy designs on Silicon may be implemented in the Silicon region(s) 24 on the chip. This is done by integrating high performance vertical Bipolar transistors in conjunction with high performance CMOS devices on the same chip. While a graded Si—Ge layer forms the base of a bipolar transistor, epitaxial Si grown on top of the graded Si—Ge layer forms the emitter.

In addition to depositing Si—Ge on Silicon, Silicon is deposited on the Si—Ge. Due to lattice mismatch between Si—Ge and Silicon, the carrier mobility is improved, thereby improving the performance of the semiconductor device. Additionally, the strain causes the carriers to be restricted to the surface Silicon layer. This improves short channel effects thereby reducing leakage and therefore standby power consumption. The method 10 and the semiconductor device 20 itself provides that the Si—Ge forms the base of a bipolar transistor, while the Silicon on the Si—Ge forms the emitter of the bipolar transistor. This structure offers improved device performance because of the seamless crystal transition from the collector to the emitter.

The method 10 shown in FIG. 1 provides that initially there is standard CMOS process flow up to pattern zero mask layer to define initial alignment marks (box 30 in FIG. 1). Then, a thermal pad is grown and Silicon dioxide is screened (box 40 in FIG. 1) thereby providing layers of oxide 32, Polysilicon (or Silicon nitride) 34, and Silicon nitride (or oxide) 36 on a Silicon substrate 38. Then, Field Isolation definition and subsequent standard processing is continued (box 50 in FIG. 1). Then, regions are defined and the collector, N-well and Vt regions are implanted on the wafer (box 60 in FIG. 1). Then, the MOS transistors are defined (Polysilicon gates with LDD implants, sidewall spacers and source drain implants) (box 70 in FIG. 1). Then, a Silicon nitride layer or any other hard masking material layer that will not interact with a selective epitaxial deposition of Silicon Germanium is deposited (box 80 in FIG. 1). Then, as shown in FIG. 2, a photolithography process is used (hence, a mask 42 is typically employed as shown in FIG. 3) to define the area 44 where an HBT device is to be formed (over the collector region). Then, as shown in FIG. 4, the Silicon nitride layer 36 and Polysilicon 34 is plasma etched to expose the underlying oxide layer 32 (box 90 in FIG. 1). Then, a Silicon nitride layer is deposited and then etched (using a RIE etch) to leave sidewall spacers 46 on the sides of Polysilicon layer as shown in FIG. 5 (see also FIG. 1, wherein box 100 corresponds to this step). Then, as shown in FIG. 6, a portion of the oxide layer 32 is wet etched to remove the oxide and undercut the Polysilicon layer (box 110 in FIG. 1). Then, as shown in FIG. 7, selective epitaxial deposition is used to grow the appropriately doped (preferably n-type for mobility and gain reasons) Si—Ge layer for base region 52 (box 120 in FIG. 1) and Silicon is deposited to provide an emitter 54, thereby providing an HBT device which includes a Silicon substrate 38, a base 52, an emitter 54, insulating sidewall spacers 46 and Polysilicon for base contact. Then, the wafer is RTP annealed to activate the implants and processing is continued to define interconnect wiring (box 130 in FIG. 1).

FIGS. 8–12 depict an alternative approach using Silicon nitride 62 instead of layers of Polysilicon 34 and Silicon nitride 36, wherein contact to base is made by Tungsten plugs or other metallic contacting material. Specifically, as shown in FIG. 9, a thermal pad is grown and Silicon dioxide is screened on a Silicon substrate 38, thereby providing layers of Silicon nitride 62 and oxide 32 on the Silicon substrate 38 (box 200 in FIG. 8). Then, as shown in FIG. 10, photolithography is used to define where a HBT device will be placed and the layer of Silicon nitride 62 is etched to expose the Silicon dioxide 32 (box 202 in FIG. 8) (area 63 in FIG. 10). Then, as shown in FIG. 11, a region of Silicon dioxide 32 is wet etched to undercut the Silicon nitride 62 (box 204 in FIG. 8) (area 65 in FIG. 11). Then, as shown in FIG. 12, an Si—Ge base 72 and emitter 74 are grown/deposited (box 206 in FIG. 8), and the process is continued to show the deposition of the intermetal dielectric, tungsten plug (76) creation (to contact base 72 and emitter 74), metal patterning and etch for contact to HBT device (box 208 in FIG. 8). As shown in FIG. 12, preferably the device includes an insulating material 78, such as Silicon nitride.

While embodiments of the present invention are shown and described, it is envisioned that those skilled in the art may devise various modifications of the present invention without departing from the spirit and scope of the appended claims.

What is claimed is:

1. A method of making a semiconductor device comprising:

providing a Silicon substrate;

forming a Silicon dioxide layer on the Silicon substrate;

forming at least one of a Polysilicon and Silicon nitride layer on the silicon dioxide layer;

removing at least a portion of the Silicon dioxide layer which is disposed on the Silicon substrate in order to expose a portion of the Silicon substrate and create an undercut under the at least one of the Polysilicon and Silicon nitride layer;

after creating the undercut, depositing Si—Ge on the Silicon substrate, in the undercut under the at least one of the Polysilicon and Silicon nitride layer;

depositing a metallic contacting material in contact with the Si—Ge;

depositing an insulating material on the metallic contacting material; and providing that said semiconductor device is configured such that the Si—Ge forms the base of a transistor.

2. A method as defined in claim 1, wherein the step of removing at least a portion of the Silicon dioxide layer comprises etching the portion of the Silicon dioxide layer.

3. A method as defined in claim 1, wherein the step of forming a Si—Ge layer on the exposed portion of the Silicon substrate comprises epitaxially growing the Si—Ge layer.

4. A method as defined in claim 1, wherein the metallic contacting material comprises tungsten.

5. A method as defined in claim 1, wherein the insulating material comprises Silicon nitride.

6. A method as defined in claim 4, wherein the insulating material comprises Silicon nitride.

* * * * *